(12) United States Patent
Campbell et al.

(10) Patent No.: US 10,372,182 B2
(45) Date of Patent: Aug. 6, 2019

(54) REDUCING THERMAL CYCLING FATIGUE

(71) Applicant: International Business Machines Corporation, Armonk, NY (US)

(72) Inventors: Eric J. Campbell, Rochester, MN (US); Sarah K. Czaplewski-Campbell, Rochester, MN (US); Jennifer I. Bennett, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 85 days.

(21) Appl. No.: 15/405,850

(22) Filed: Jan. 13, 2017

(65) Prior Publication Data

US 2018/0203495 A1 Jul. 19, 2018

(51) Int. Cl.
| | |
|---|---|
| *G06F 9/00* | (2006.01) |
| *G06F 1/26* | (2006.01) |
| *H01L 23/34* | (2006.01) |
| *H01L 23/053* | (2006.01) |
| *H05K 1/02* | (2006.01) |
| *H01L 23/00* | (2006.01) |
| *G06F 1/20* | (2006.01) |

(Continued)

(52) U.S. Cl.
CPC .............. *G06F 1/266* (2013.01); *G06F 1/206* (2013.01); *H01L 23/053* (2013.01); *H01L 23/34* (2013.01); *H01L 23/345* (2013.01); *H01L 23/367* (2013.01); *H01L 24/32* (2013.01); *H05K 1/0212* (2013.01); *H05K 1/0271* (2013.01); *H05K 3/3436* (2013.01); *H01L 2224/32245* (2013.01); *H05K 2201/10151* (2013.01); *H05K 2201/10734* (2013.01); *Y02P 70/613* (2015.11)

(58) Field of Classification Search
CPC ....... G06F 1/266; G06F 1/206; H01L 23/053; H01L 23/34; H01L 23/345; H01L 23/3675; H01L 24/32; H05K 1/0203; H05K 1/0212; H05K 1/181
USPC .................. 219/209, 486, 210, 494; 700/300
See application file for complete search history.

(56) References Cited

U.S. PATENT DOCUMENTS

| | | | |
|---|---|---|---|
| 5,583,378 A | 12/1996 | Marrs et al. | |
| 6,262,392 B1 * | 7/2001 | Morton | H05B 3/00 219/209 |

(Continued)

OTHER PUBLICATIONS

Campbell et al., "Reducing Thermal Cycling Fatigue", U.S. Appl. No. 15/800,155, filed Nov. 1, 2017.

(Continued)

*Primary Examiner* — Aurel Prifti
(74) *Attorney, Agent, or Firm* — Edward J. Wixted, III

(57) ABSTRACT

An approach to reduce thermal cycling fatigue associated with an identified component in an electrical system. The approach includes a controller determining power to the electrical system is turned off and initiating power from an external power source to one or more heating elements in a vicinity of the identified component. The approach includes a controller receiving a first temperature from one or more temperature sensors in the vicinity of the identified component and determining whether the first temperature is within a predetermined temperature range. Responsive to the controller determining that the first temperature is not within the predetermined temperature range, the approach includes the controller adjusting a power level of the one or more heating elements.

8 Claims, 4 Drawing Sheets

(51) Int. Cl.
    *H01L 23/367*    (2006.01)
    *H05K 3/34*      (2006.01)

(56)        References Cited

U.S. PATENT DOCUMENTS

| | | |
|---|---|---|
| 6,525,942 B2 | 2/2003 | Huang et al. |
| 6,781,056 B1 | 8/2004 | O'Rourke et al. |
| 7,031,219 B2 | 4/2006 | Hsu et al. |
| 7,161,239 B2 | 1/2007 | Zhao et al. |
| 7,698,023 B2 * | 4/2010 | Barry .................. H01L 23/3121 |
| | | 219/486 |
| 8,093,535 B2 * | 1/2012 | Heismann ................ G01K 7/01 |
| | | 219/210 |
| 8,220,545 B2 | 7/2012 | Storm |
| 8,489,217 B2 | 7/2013 | Cher et al. |
| 8,927,909 B2 * | 1/2015 | Le Neel .............. H05B 1/0227 |
| | | 219/494 |
| 9,012,811 B2 * | 4/2015 | White ...................... H05B 3/28 |
| | | 219/209 |
| 9,148,910 B1 * | 9/2015 | Mimran ................. H05B 1/023 |
| 2006/0255476 A1 * | 11/2006 | Kuhlman ............... H05K 3/341 |
| | | 257/782 |
| 2009/0312887 A1 * | 12/2009 | Barry .................. H01L 23/3121 |
| | | 700/300 |
| 2017/0063088 A1 * | 3/2017 | Wang ..................... G05B 15/02 |
| 2017/0188448 A1 * | 6/2017 | Liang .................... H05K 1/0203 |
| 2017/0212569 A1 * | 7/2017 | Valdez ...................... H02J 9/06 |

OTHER PUBLICATIONS

List of IBM Patents or Patent Applications Treated as Related. Filed Nov. 1, 2017. 2 pages.

* cited by examiner

12

REDUCING THERMAL CYCLING FATIGUE

BACKGROUND OF THE INVENTION

The present invention relates generally to the field of electronic packaging, and more particularly to reducing thermal cycling fatigue of components in computer systems and other electrical systems.

Thermal cycling fatigue of interconnections such as solder joints between various components composed of materials with different coefficients of thermal expansion is a fundamental problem in many electronic assembly applications used in many different industries. In computer systems and other electrical systems, frequent temperature cycling of the various components such as semiconductor chips, module substrates, printed circuit boards, connectors, and other associated hardware due to powering off and on the system may result in thermal cycling fatigue fails.

Energy sensitive computer users who power down computer systems on a regular basis as an energy saving measure may create an increase in thermal cycling experienced by computer components and hardware. Additionally, a rise in the use of portable electronics and portable computers such as tablets, smartphones, and notebooks, which may experience multiple on/off cycles per day, increases thermal cycling of components and associated interconnections.

Mechanical modeling programs for predicting thermal cycling fatigue in components and interconnections between various components in an electrical system are commonly used to identify components and associated interconnections most likely to experience thermal fatigue fails in an electrical system.

SUMMARY

Embodiments of the present invention provide a method and an apparatus to reduce thermal cycling fatigue associated with an identified component in an electrical system. The method includes a controller determining power to the electrical system is turned off and initiating power from an external power source to one or more heating elements in a vicinity of the identified component. The method includes a controller receiving a first temperature from one or more temperature sensors in the vicinity of the identified component and determining whether the first temperature is within a predetermined temperature range. Responsive to the controller determining that the first temperature is not within the predetermined temperature range, the method includes the controller adjusting a power level of the one or more heating elements.

DETAILED DESCRIPTION

Figure 1:
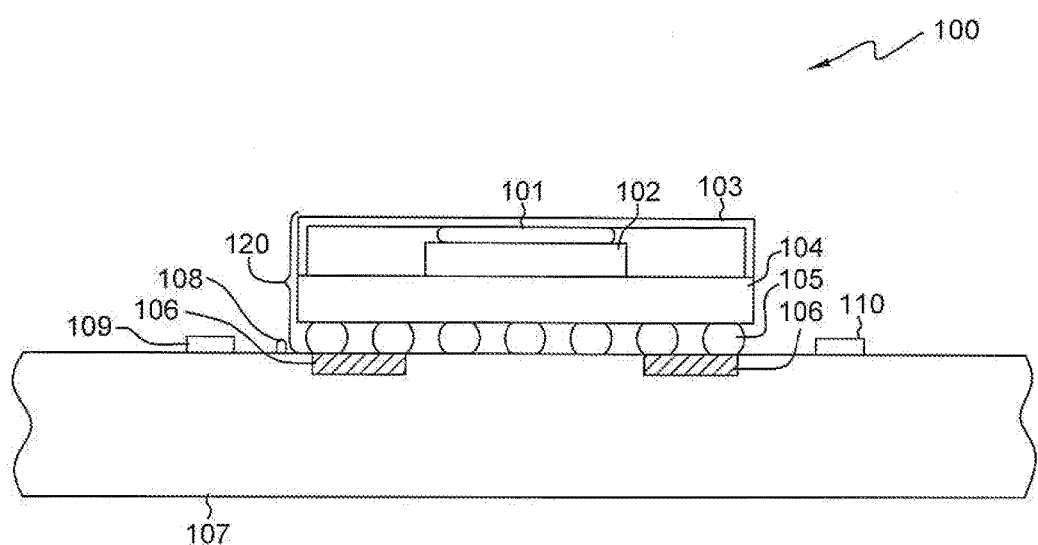
FIG. 1 depicts a cross-sectional view of an electronic assembly for reducing thermal cycling fatigue associated with a sensitive component, in accordance with an embodiment of the present invention.

Detailed embodiments of the claimed structures and methods are disclosed herein. The method steps described below do not form a complete process flow for manufacturing packaging for integrated circuits such as chip carrier packaging and second level packaging assemblies using printed circuit boards (PCB). The present embodiments can be practiced in conjunction with integrated circuit fabrication, integrated circuit packaging for module assemblies, and/or second level (e.g., PCB) assembly manufacture as may be used in a computer system or other electrical system using techniques currently used in the art. For illustrative purposes, the figures and discussion include only a subset of the commonly practiced process steps as are necessary for an understanding of the described embodiments. The figures represent cross-section portions of a semiconductor module and an assembled PCB with heating elements in an electronic assembly in a computer system, however, embodiments of the present invention are not limited to the components, or the electronic assembly depicted, and the concepts and methods described herein may be applied to other electronic components and other types of electrical systems. The figures are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment", etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure or characteristic in connection with other embodiments, whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps or operations that are known in the art may have been combined together for presentation and for illustration purposes, and in some instances may not have been described in detail. In other instances, some processing steps or operations that are known may not be described. It should be understood that the following description is rather focused on the distinctive features or elements of the various embodiments of the present invention.

Embodiments of the present invention provide a method and an apparatus to reduce thermal cycling fatigue in an electronic assembly. Embodiments of the present invention provide a method to reduce thermal cycling fatigue associated with one or more identified components, such as a semiconductor module, sensitive to temperature cycling fatigue. Embodiments of the present invention include the use of one or more heating elements located in or thermally coupled to one or more identified components in an electronic assembly to reduce thermal cycling fatigue by reducing a range of a temperature change experienced by the identified components and/or interconnections associated with the identified component during a thermal cycle due to a system power off/on cycle. Embodiments of the present invention provide a method and an apparatus to reduce thermal cycling fatigue associated with an identified component in an electronic assembly by maintaining a temperature associated with the identified component in a desired temperature range during normal operation of a powered electronic assembly.

Embodiments of the present invention propose a method to reduce thermal cycling fatigue associated with one or more identified components by providing power to the identified component from an external power source when an associated electrical system, such as a computer system, is turned off. Maintaining power to the identified components sensitive to thermal cycling fatigue, when the identified components include active or passive devices capable sustaining heat in the identified components, reduces thermal cycling fatigue by reducing the range of temperature excursion experienced by the identified components and associated interconnections to the identified components, thereby reducing thermal cycling fatigue.

Furthermore, embodiments of the present invention provide a method to reduce pumping out of a thermal interface material in semiconductor modules with a lid and/or a heat sink that thermally connects the semiconductor chip to the lid and/or the heat sink. Pump out is a phenomenon, known to one skilled in the art, that occurs during thermal cycling as a semiconductor chip and a lid and/or a heat sink thermally coupled to the semiconductor chip bow in opposite directions during thermal expansion and contraction extruding the thermal interface material out from a center portion of semiconductor chip. Pump out reduces the amount of the thermal interface material in contact with the semiconductor chip thereby reducing thermal conductivity between the semiconductor chip and the lid and/or the heat sink. Embodiments of the present invention reduces the range of a temperature excursion experienced by the identified component during a power ON cycle and reduces the movement of the lid and/or heat sink in contact with the thermal interface material and the movement of the semiconductor chip covered by the thermal interface material thereby, reducing pump out of the thermal interface material associated with the semiconductor chip.

FIG. 1 depicts a cross-sectional view of an electronic assembly 100 for reducing thermal cycling fatigue associated with sensitive component 120 in accordance with an embodiment of the present invention. As depicted, FIG. 1 includes electronic assembly 100, with thermal interface material 101, chip 102, lid 103, module substrate 104, interconnects 105, heating elements 106, PCB 107, temperature sensor 108, battery 109, controller 110, and sensitive component 120. Electronic assembly 100 may be any known type of assembly of electronic components and/or other components used in an electrical circuit in an electrical system. For example, electronic assembly 100 may be used in a computer system, a game system, or an aerospace application.

In various embodiments, sensitive component 120 includes thermal interface material 101, chip 102, lid 103, module substrate 104, and interconnects 105. In some embodiments, one or more of thermal interface material 101, chip 102, and lid 103 are not present. In various embodiments, sensitive component 120 is an active component, such as a semiconductor module. In an embodiment, sensitive component 120 is a passive component, such as a connector, cable, capacitor, or the like. Sensitive component 120 may include, but is not limited to a ceramic module (e.g., ceramic ball grid array module, ceramic column grid array module, a ceramic leadless module, pin-in-hole module, etc.), a lead frame module, a plastic module (e.g., a PCB ball grid array, a flex film module, etc.), a silicon-on-insulator module, a photosensitive device module (e.g., LED or solar cell), a surface mount module, a connector, a cable, or other electrical component capable of experiencing fatigue failures associated with thermal cycling. In some embodiments, sensitive component 120 includes one or more of the following chip 102, heating elements 106, temperature sensor 108, battery 109, and controller 110. In some embodiments, more than one sensitive component 120 is present in electronic assembly 100.

Sensitive component 120 is any component in an electrical system such as a computer system, aerospace system, a consumer system, and the like that is determined to be at risk for thermal cycling fatigue. Identifying or determining one or more components as a component at risk for thermal cycling fatigue includes determining a component is sensitive or prone to thermal cycling fatigue. A sensitivity of thermal cycling fatigue may be determined for a component by one the following methods but is not limited to, mechanical modeling, accelerated thermal cycling tests, an analysis of field returns, an analysis of previous historical data on similar or the same component in other similar electrical systems, and engineering judgment. For example, a sensitivity to thermal cycling fatigue for sensitive component 120 is determined by an accelerated thermal cycling test of sensitive component 120 on a PCB in a test chamber simulating the computer system power ON/OFF cycles. The accelerated thermal cycling test may identify the possibility of a thermal cycling fatigue fail associated with sensitive component 120 occurring during a predicted life of the computer system.

Thermal interface material 101 is any known thermally conductive material for conducting heat from chip 102 to lid 103 and/or to a heat sink (not depicted in FIG. 1) attached to lid 103 or attached directly to chip 102 (not depicted). Thermal interface material 101 may be a thermal grease, a thermal putty, a thermal oil, a thermal pad, a thermal gap filler, and the like residing between chip 102 and lid 103, which may be an integrated heat sink. In various embodiments, thermal interface material 101 is a compliant material and/or a material that moves and experiences pump out during thermal cycling. In some embodiments, thermal interface material 101 is not present.

Chip 102 is any known semiconductor device. Chip 102 may include microprocessors, application-specific integrated circuits (ASICs), silicon-on-insulator devices and photosensitive devices such as light emitting diodes (LEDs), solar cells, and the like. In various embodiments, chip 102 is electrically connected or coupled to module substrate 104 using any known interconnection method such as solder bumps, wire bonds, and the like (not depicted). In an embodiment, chip 102 is connected directly to PCB 107 or another element capable of connecting to chip 102 (e.g., a flex cable, etc.) using known interconnection methods such as wire bonding, solder bumps, and the like. In various embodiments, chip 102 may be thermally connected or coupled to lid 103 and/or a heat sink (not depicted) by thermal interface material 101. In an embodiment, chip 102 is not thermally connected to lid 103 or a heat sink. In an embodiment, chip 102 includes one or more heating elements (not depicted) that may cover a portion of a layer of chip 102. In one embodiment, controller 110 is included in a portion of chip 102.

Lid 103 is any known lid, module cover and/or heat sink. In various embodiments, lid 103 is coupled to chip 102, module substrate 104, and thermal interface material 101. In some embodiments, lid 103 is thermally coupled to a heat sink and chip 102 by thermal interface material 101. In an embodiment, lid 103 is a heat sink using thermal interface material 101 as a thermal conduit transmitting heat from chip 102 to lid 103. In some embodiments, thermal interface material 101 is not present. In one embodiment, lid 103 is an encapsulation material for chip 102 (e.g., glob top). In an embodiment, lid 103 includes one or more heating elements in or on a portion of a surface of lid 103. In one embodiment, lid 103 may not be present. In one embodiment, battery 109 resides on lid 103.

Module substrate 104 represents any known module substrate. Module substrate 104 may be a ceramic module substrate, a laminate or PCB module substrate, a flexible film substrate, a metal substrate, or the like, used to interconnect chip 102 with other circuit components, for example, in a computer system. As depicted, module substrate 104 is connected to chip 102 by interconnects (not depicted) and to PCB 107 by interconnects 105. In an embodiment, module substrate 104 is not present. In various embodiments, module substrate 104 includes one or more heating elements 106. In an embodiment, one or both of controller 110 and battery 109 are coupled with module substrate 104.

Interconnects 105 are any known interconnection method between various levels of electronic packaging or between various types of electrical components, for example, between sensitive component 120 and PCB 107 and/or between chip 102 and module substrate 104 (not depicted in FIG. 1). As depicted, interconnects 105 are solder balls used to create solder joints that connect module substrate 104 of sensitive component 120 to PCB 107, however, interconnects 105 are not limited to solder balls or to connections between module substrate 104 and PCB 107. Interconnects 105 may include any known interconnect method such as wire bonds, solder joints including solder balls, solder columns, pins, J-leads, or leadless interconnections, adhesive based interconnections, other metal based interconnections (e.g., between a semiconductor chip or LED and a carrier), pad to pad connections, connector connections, and the like. In various embodiments, interconnects 105 are associated with sensitive component 120 (e.g., connect sensitive component 120 to another component such as PCB 107).

Heating elements 106 are any known heating elements capable of providing heat to one or more of the various components in the vicinity of sensitive component 120. Heating elements 106 may be a resistive thick or thin film, a resistor, a resistive wire, a resistive line, a thermistor, a resistive metal, a capacitor, and the like capable of being embedded in, attached on, or under one or more of the components of electronic assembly 100 and generating heat when receiving electrical power or current. As depicted in FIG. 1, heating elements 106 are embedded in PCB 107 under the peripheral rows of interconnects 105 of sensitive component 120 but are not limited to this location. In various embodiments, one or more heating elements may reside in, on, or under a portion of a next level carrier of sensitive component 120 such as PCB 107, in, on, or under a portion of sensitive component 120 (depicted in FIG. 2), in, on, or under a portion of chip 102 (not depicted), in, on, or under a portion of lid 103 (depicted in FIG. 3) or a heat sink (depicted in FIG. 4). For example, heating elements 106 are located on PCB 107 within 25 mm of sensitive component 120. Heating elements 106 are electrically coupled to controller 110 and an external power source such as battery 109.

In various embodiments, heating elements 106 receive power from battery 109 or an alternating current power source, such as a standard wall plug-in. In an embodiment, heating elements 106 provide a level of heat to maintain a temperature associated to sensitive component 120 within a desired temperature range when the electrical system is powered on (e.g., maintains a temperature determined in or in the vicinity of sensitive component 120 within a desired range during a normal power on operation of the electrical system). In one embodiment, heating elements 106 may not be present. For example, when power is turned off to an electrical system including sensitive component 120, the electrical circuits of sensitive component 120 receive power from battery 109 or another external power source as determined by controller 110 to maintain a temperature in the vicinity of sensitive component 120 within a desired temperature range.

PCB 107 is any known carrier for sensitive component 120 (e.g., a next level carrier or second level of electronic packaging for sensitive module 120 in electronic assembly 100). As depicted PCB 107 is a printed circuit board. In various embodiments, PCB 107 is composed of one or more laminated layers of non-conductive materials (not depicted) between one or more layers of conductive materials (not depicted) to provide lines or traces in a signal layer(s) and/or power plane layers in PCB 107. For example, PCB 107 may be composed of one or more layers of non-conductive materials (e.g., epoxy/glass not depicted), one or more layer of conductive layers (e.g., copper layers or layer of copper lines or traces not depicted), and one or more heating elements 106, which may be embedded in one or more portions of a layer or layers of PCB 107 or on a surface of PCB 107 (not depicted). In various embodiments, PCB 107 is any next level carrier (e.g., card, flex cable, flexible film carrier, silicon carrier, another semiconductor carrier, metal carrier, etc.) capable of coupling with sensitive component 120 by interconnects 105 and including one or more heating elements 106. In one embodiment, chip 102 is attached directly to PCB 107 (e.g., wire bond direct chip attach). In various embodiments, PCB 107 includes heating elements 106, which may be either in embedded or on a surface of PCB 107. In various embodiments, controller 110 and battery 109 are included in, on, or under PCB 107.

Temperature sensor 108 is a known temperature-sensing device, such as a thermocouple, capable of determining a temperature of various elements or components in the vicinity of sensitive component 120. As depicted, temperature sensor 108 is on PCB 107 within the vicinity of sensitive component 120 (e.g., within 3 cm of sensitive component 120). In other embodiments, temperature sensor 108 may reside in sensitive component 120, in PCB 107, in the vicinity of sensitive component 120, or on a surface of sensitive component 120. In various embodiments, one or more temperature sensors 108 are present in electronic assembly 100 in the vicinity of or in sensitive component 120. For example, two temperature sensors 108 may be present on PCB 107 in the vicinity of sensitive component 120. In one embodiment, one or more temperature sensors 108 are located in or on more than one component in electronic assembly 100. For example, a temperature sensor 108 may be present under module substrate 104 and on PCB 107.

Battery 109 is electrically connected to controller 110 and heating elements 106. Battery 109 is any type of battery capable of providing power to heating elements 106. Battery 109 may be a rechargeable battery as used in a smartphone, a smart battery, a battery pack, or the like. As depicted, battery 109 may be external to sensitive component 120, for example on PCB 107. In other embodiments, battery 109 may be embedded in or on a surface of sensitive component 120, on lid 103, or in another location within an electrical system. In some embodiments, battery 109 may reside in another location outside of electronic assembly 100 within an electrical system or may reside external to the electrical system (e.g., external to a computer system). In various embodiments, battery 109 is capable of initiating power to heating elements 106 based instructions from controller 110 when an electrical system or a computer system with electronic assembly 100 is turned off. In some embodiments, for example, when controller 110 maintains power to heating elements 106 from an alternating current (AC) external power source (e.g., not depicted) such as a standard wall connection during a computer system power down, battery 109 may not be present.

Controller 110 is a controller, such as a proportional-integral-derivative (PID) controller, one or more microprocessors or other similar devices known to one skilled in the art, used in applications to monitor and control temperature of a portion of electronic assembly 100. In various embodiments, controller 110 monitors and maintains a desired temperature or a desired temperature range in a portion of sensitive component 120 or in a portion of PCB 107 in the vicinity of sensitive component 120. In various embodiments, controller 110 resides in, on, or under one of PCB 107, module substrate 104, chip 102, or another location in the electrical system (not depicted), or external to the electrical system. As depicted, controller 110 resides on PCB 107 in the vicinity of an outer row of interconnects 105 however, in other embodiments, controller 110 resides in another location in the electrical system. For example, controller 110 resides on module substrate 104. In an embodiment, controller 110 resides outside of the electrical system. In various embodiments, controller 110 in electronic assembly 100 is electrically coupled to or connected to heating elements 106, temperature sensors 108, and battery 109.

In various embodiments, ccontroller 110 determines when power is turned off to an electrical system that includes sensitive component 120 and, in response, controller 110 initiates power to heating elements 106 using an external power source, such as battery 109. Controller 110 is configured to query temperature sensor 108 for a temperature of a portion of electronic assembly 100 in the vicinity of sensitive component 120 or within sensitive component 120 when power is turned off to electronic assembly 100. Controller 110 is configured to maintain the temperature of a portion of PCB 107 in the vicinity of sensitive component 120 or in a portion of sensitive component 120 within a desired or predetermined temperature range. In various embodiments, controller 110, using an external power source (e.g., battery 109), adjusts the power level and heat emitted by heating elements 106 when the power to electronic assembly 100 is turned off. In various embodiments, controller 110 compares a received temperature associated with sensitive component 120, as detected by one or more of temperature sensors 108, to a predetermined or desired temperature range to monitor and maintain the temperature associated with sensitive component 120 within the predetermined temperature range by adjusting the heat emitted by heating elements 106.

In one embodiment, controller 110 determines that power to electronic assembly 100 is turned off, and in response, controller 110 initiates power from an external power source to sensitive component 120. For example, when controller 110 determines a computer system is powered down or turned off, controller 110 initiates external power to sensitive component 120 by one of battery 109 or other external power source. In this example, heating elements 106 are not present and/or do not receive power when the electrical system is powered down. By providing power from an external power source (e.g., battery 109) to sensitive component 120 when sensitive component 120 includes one or more active or passive devices, such as a chip 102, capable of maintaining a level of heat generation, controller 110 reduces the temperature change experienced by sensitive component 120 when the computer system is turned off. Reducing the change of temperature of sensitive component 120 when a computer system is powered down reduces thermal cycling fatigue associated with sensitive component 120.

Figure 2A:
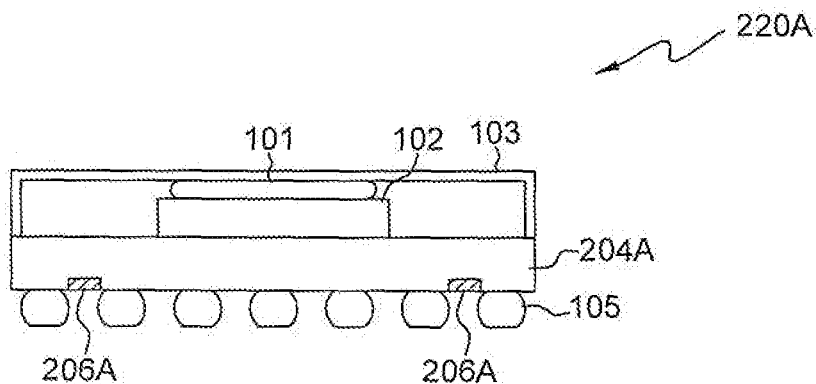
FIG. 2A depicts a cross-sectional view of a sensitive component with heating elements in a portion of a module substrate for reducing thermal cycling fatigue, in accordance with an embodiment of the present invention.

FIG. 2A depicts a cross-sectional view of sensitive component 220A with heating elements 206A in a portion of module substrate 204A for reducing thermal cycling fatigue in accordance with an embodiment of the present invention. As depicted, FIG. 2A includes thermal interface material 101, chip 102, lid 103, module substrate 204A, heating elements 206A, and interconnects 105. In an embodiment, one or more of thermal interface material 101 and lid 103 are not present. Sensitive component 220A with module substrate 204A and heating elements 206A may include some similar components as depicted and discussed with respect to FIG. 1 to provide a reduction in thermal cycling fatigue in electronic assembly 100. Module substrate 204A includes one or more heating elements 206A. In various embodiments, heating elements 206A are embedded in a portion of one or more layers of module substrate 204A and/or in one or more layers of module substrate 204A. For example, heating elements 206A are in an outer portion of a layer such as between interconnects 105 at outer edges or periphery of module substrate 204A (as depicted) but are not limited to this location. Heating elements 206A receive power from an external power source (e.g., battery 109 in FIG. 1), as determined by controller 110 (depicted in FIG. 1) when power is turned off during an electrical system or computer system power down.

Figure 2B:
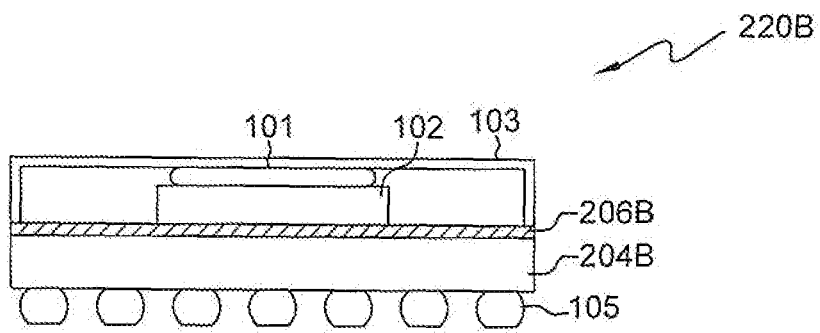
FIG. 2B depicts a cross-sectional view of a sensitive component with heating elements in another portion of a module substrate for reducing thermal cycling fatigue, in accordance with an embodiment of the present invention.

FIG. 2B depicts a cross-sectional view of sensitive component 220B with heating elements 206B in a portion of module substrate 204B, other than that depicted in FIG. 2A, for reducing thermal cycling fatigue in accordance with an embodiment of the present invention. In another example, heating elements 206B may be a thick film resistor in a layer or a portion of one or more layers embedded in module substrate 204B or on an outer surface or a portion of an outer surface of module substrate 204B (e.g., a layer of a thick or a thin film resistor material on module substrate 204B). The location of heating elements 206A and heating elements 206B (depicted in FIG. 2B) may be determined as result of mechanical modeling, analysis of thermal cycling fatigue fails, an analysis of field returns, engineering judgment, or other analysis.

Figure 3:
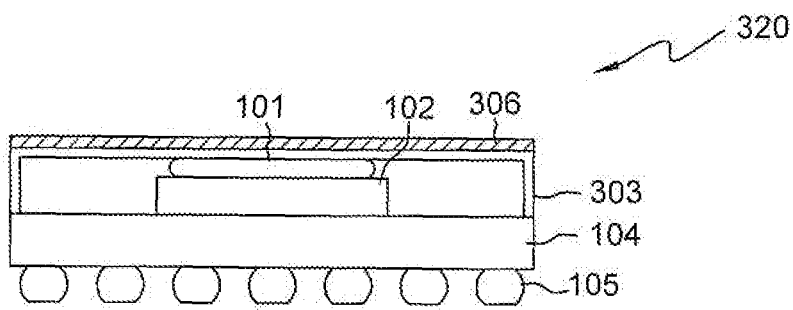
FIG. 3 depicts a cross-sectional view of a sensitive component with a heating element on a module lid for reducing thermal cycling fatigue, in accordance with an embodiment of the present invention.

FIG. 3 depicts a cross-sectional view of sensitive component 320 with heating element 306 on lid 303 for reducing thermal cycling fatigue in accordance with an embodiment of the present invention. Sensitive component 320 with heating elements 306 on lid 303 may include some similar components as depicted and discussed with respect to FIG. 1 to provide a reduction in thermal cycling fatigue in electronic assembly 100. As depicted, FIG. 3 includes thermal interface material 101, chip 102, heating element 306, lid 303, module substrate 104, and interconnects 105. In various embodiments, heating element 306 is on the top of lid 30, is under lid 303, or is embedded in lid 303. Heating element 306 receives power from an external power source (e.g., battery 109 in FIG. 1) when initiated by controller 110 (depicted in FIG. 1) when power to an electrical system or a computer system containing sensitive component 306 is turned off. Heating element 306 may transmit heat to chip 102 and/or through lid 103 to module substrate 104 and interconnects 105 to reduce thermal cycling fatigue of sensitive component 320 when the power is turned off.

Figure 4:
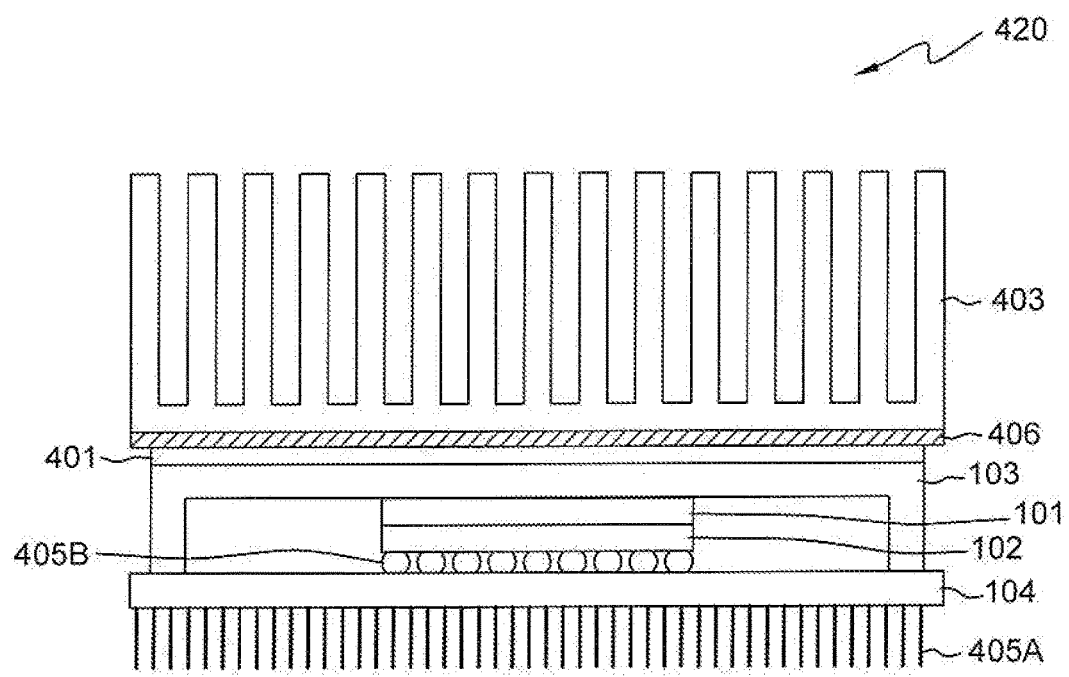
FIG. 4 depicts a cross-sectional view of a sensitive component with a heating element thermally coupled to a heat sink for reducing thermal cycling fatigue, in accordance with an embodiment of the present invention.

FIG. 4 depicts a cross-sectional view of sensitive component 420 with heating element 406 thermally coupled to heat sink 403 for reducing thermal interface material pump out in accordance with an embodiment of the present invention. Sensitive component 420 with heating elements 406 associated with heat sink 403 may include some similar components as depicted and discussed with respect to FIG. 1 to provide a reduction in thermal cycling fatigue in electronic assembly 100. FIG. 4 includes the various elements thermal interface material 101, chip 102, lid 103, module substrate 104, as previously discussed in detail with respect to FIG. 1, along with thermal interface material 401, heat sink 403, interconnects 405A, interconnects 405B, and heating element 406. FIG. 4 depicts one embodiment of sensitive component 420 with heating element 406 included as a layer, such as a thin resistive metal layer, on a surface of heat sink 403. In various embodiments, heating element 406 resides in one or more other locations on, in, or under a portion of heat sink 403. For example, heating element 406 may be a number of resistive wires residing the valleys between each of the heat sink fins (e.g., on the horizontal surface of heat sink 403 between or adjacent to the vertical elements or fins). Interconnects 405A coupling module substrate 104 to PCB 107 (not depicted) are pins as may be used in in a pinned sensitive module 420, which may be soldered to or joined with PCB 107 by a pin-in-hole connector. Interconnects 405B, as depicted, connect chip 102 to module substrate 104, for example by solder connections however, interconnects 405B may be another type of chip 102 to module substrate 104 connection (e.g., wire bonds, etc.).

Heating elements 406, and/or heating elements 106, 206A, 206B, 306, or heating elements in chip 102 (not depicted, and as discussed with respect to FIGS. 1, 2A, 2B, and 3) may reduce pump out of thermal interface material 401 from between the heat sink 403 and lid 103 and/or from between lid 103 and chip 102. For example, using the method discussed below in detail with respect to FIG. 5, the effect of the thermal expansion differences in chip 102, lid 103, and heat sink 403 that cause pump out can be minimized. For example, as known to one skilled in the art, chip 102 and heat sink 403 may bow in opposing directions due to differences in thermal expansion and contraction of the various materials used in sensitive module 420. Reducing the temperature excursions experienced by chip 102, lid 103, and heat sink 403 by using one or more of heating elements 106, 206A, 206B, 306, or 406 reduces the extrusion or pump out of thermal interface material 401. Less bowing of chip 102, lid 103, and heat sink 403 reduces extrusion or the loss of thermal interface material between the center portion of lid 103 corresponding to chip 102 and a center portion of heat sink 403 (e.g., corresponding to chip 102).

Figure 5:
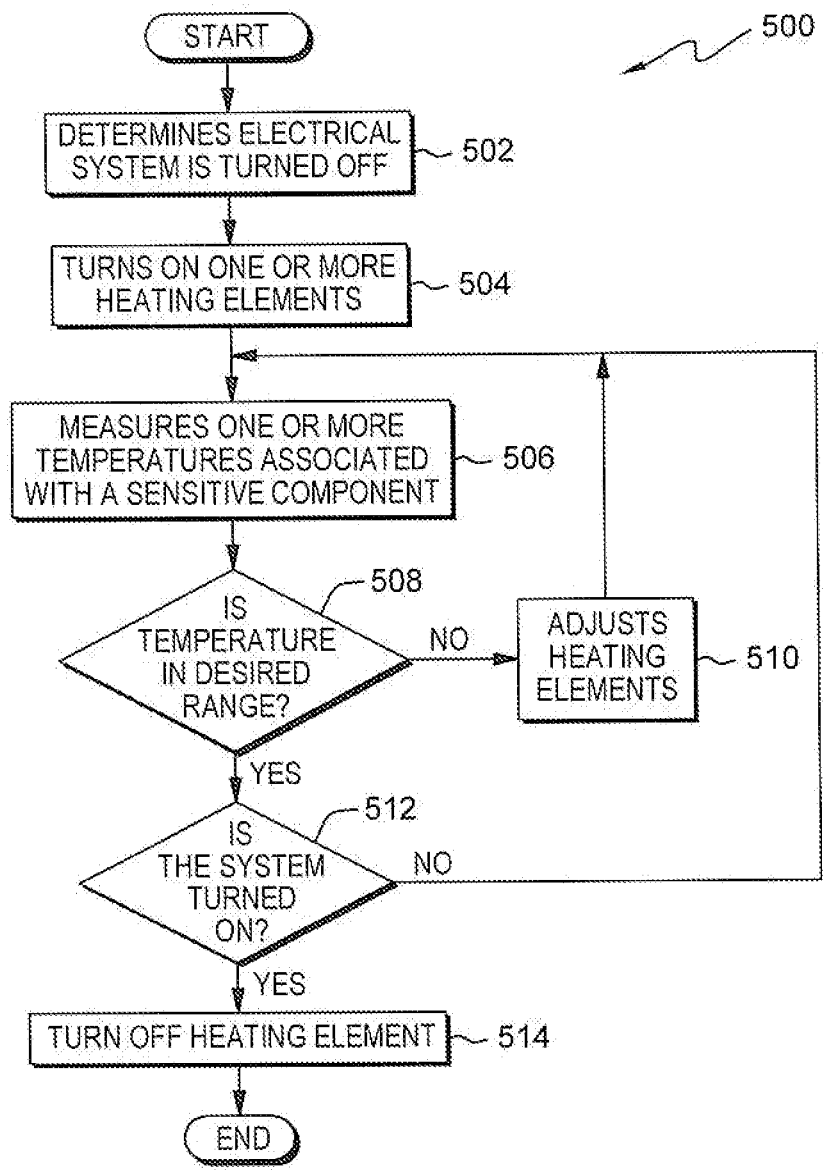
FIG. 5 is a flowchart depicting operational steps of one example of a method to reduce thermal cycling fatigue associated with a sensitive component in an electronic assembly as depicted in FIG. 1, in accordance with an embodiment of the present invention.

FIG. 5 is a flowchart 500 depicting operational steps of one example of a method to reduce thermal cycling fatigue associated with sensitive component 120 in an electronic assembly 100 as depicted in FIG. 1, in accordance with an embodiment of the present invention. As depicted, FIG. 5 includes one example of a method to reduce thermal fatigue cycling in interconnects 105 connecting sensitive component 120 and PCB 107 in an electrical system. The method discussed with respect to PCB 107 connected by interconnects 105 to module substrate 104, however, various embodiments of the present invention are not limited to reducing thermal cycling fatigue associated to sensitive component 120, but, may be applied to other components in the computer system, to components in other electrical systems (e.g., chip 102 to PCB 107 in consumer applications). Additionally, the method discussed in flowchart 500 may be applied to other embodiments of the present invention discussed above. For example, the method discussed with respect to flowchart 500 may be applied with the various embodiments of the present invention discussed with respect to FIGS. 2A, 2B, 3, and 4.

Controller 110 determines the electrical system power is turned off (502). Controller 110 identifies that the power to an operating electrical system, for example, the power to a computer system, is disconnected or turned off. When power is turned off in an operating electrical system, a cooling portion of a thermal cycle is initiated. In some embodiments, controller 110 does not determine if a power source is disconnected or turned off to an electrical system or a computer system that includes sensitive component 120.

Controller 110 turns on one or more heating elements 106 (504). In an embodiment, controller 110 initiates power to heating elements 106 in PCB 107 using an external power source such as battery 109. For example, controller 110 initiates external power from battery 109 to heating elements 106 when controller 110 determines an electrical system power is turned off. In one embodiment, depicted in FIG. 1, heating elements 106 may be in or on an outer layer of PCB 107 in the vicinity or under of the outer row interconnects 105 on the periphery of sensitive component 120. Heating elements 106 are in the vicinity of sensitive component 120 and interconnects 105. As previously discussed with respect to FIGS. 1 and 2B, heating elements 106 may be located in one or more positions in a portion of PCB 107 or in a portion of sensitive component 120. For example, one or more heating elements 206B may be in or on a portion of a top surface of module substrate 204B (depicted in FIG. 2B). In one embodiment, controller 110 powers on heating elements 106 residing in chip 102 when power is turned off to an electrical system. For example, one or more heating elements 106 may reside in an outer portion of a layer of a semiconductor device such as chip 102 or in a layer of chip 102, for example, in a layer deposited during or before the back end of the line (BEOL) semiconductor processes.

In an embodiment, controller 110 initiates an external power source to supply power or turn on heating elements 106 on either lid 103 and/or on a module heat sink (e.g., heat sink 403 in FIG. 4) associated with sensitive component 120. For example, heating elements 306 may reside on a portion of lid 303 (depicted in FIG. 3) coupled to sensitive module 320 (e.g., by thermal interface material 101). For example, one or more heating elements 306 (not depicted) may cover a portion of lid 303 along the periphery or outer edges where lid 303 attaches to module substrate 104. In some embodiments, controller 110 does not automatically turn on or initiate power to heating elements 106 using an external power source such as battery 109.

In one embodiment, controller 110 turns on heating elements 106 associated with sensitive component 120 located in more than one component in electronic assembly 100. For example, using an external power source such as an alternating current source or battery 109, controller 110 may initiate power to heating elements 106 in PCB 107 (depicted in FIG. 1) and heating elements 206B in module substrate 204B (depicted in FIG. 2B) when power is turned off to electronic assembly 100 in a computer system. Initiating power to heating elements 106 and heating elements 206B on both a module substrate 204B and PCB 107 allows controller 110 to precisely control the temperature in the vicinity of sensitive component 120 and/or reduce a temperature drop experienced by interconnects 105 and an identified component, such as sensitive component 220B, during a cool down portion of a thermal cycle during a computer system or other electrical system power down.

In an embodiment, controller 110 turns on or initiates power to sensitive component 120 from an external power source when controller 110 determines that power to the electronic system associated with sensitive component 120 is turned off. For example, controller 110, upon determining the power is turned off in a computer system, may initiate power to sensitive component 120 using one of a direct power (DC) power source such as battery 109 or an external power source such as alternating power (AC) source. When controller 110 initiates an external power source to maintain power to sensitive component 120 and when sensitive component 120 contains active or passive devices capable of generating heat, a reduction in the range of the temperature excursion during power off/on experienced by sensitive component 120 occurs. When controller 110 supplies external power to sensitive component 120, which has active or passive devices capable of continued heat generation, thermal cycling fatigue of interconnects 105 associated with sensitive component 120 is reduced due to a smaller temperature change during a power off/on thermal cycle.

Controller 110 measures one or more temperatures associated with a sensitive component (506). In various embodiments, controller 110 queries temperature sensor 108 in one or more locations in the vicinity of sensitive component 120 (e.g., on a surface of PCB 107 within 25 mm of sensitive component 120). In various embodiments, controller 110 queries temperatures associated with one or more temperature sensors 108 in one or more locations that may be in, on, or under sensitive component 120. For example, controller 110 queries two temperature sensors 108 (not depicted in FIG. 1) present on lid 103 of sensitive component 120 for a current temperature.

Controller 110 determines whether the temperature is in a desired range (decision 508). Controller 110 compares the temperature measured in the vicinity of or in sensitive component 120 to a desired temperature range to determine if the current temperature associated with sensitive component 120 is within the desired temperature range. In various embodiments, controller 110 is configured with a predetermined or desired temperature range.

The predetermined temperature range may be determined, for example, based on one or more of the following known methods. The predetermined temperature range or a desired temperature range may be determined, for example, by mechanical modelling predicting thermal cycling fatigue associated with sensitive module 120 (e.g., finite element modelling or the like using various temperature ranges), analysis of fatigue fails of sensitive component 120 from field returns of computer systems or other electrical systems in various environments and/or operating conditions, analysis of thermal profiles of other components similar to sensitive component 120 in other similar system environments, engineering judgment, or the like.

Responsive to controller 110 determining that the temperature is not in the desired temperature range (no branch of decision 508), controller 110 adjusts heating elements 106 (510). Controller 110 may adjust or change the power level or the temperature of heating elements 106 using known methods, for example, by changing the current or power supplied to heating elements 106. If the current temperature of sensitive component 120 or the temperature in the vicinity of interconnects 105 to sensitive component 120 (e.g., a temperature of PCB 107 near an outer row of interconnects 105) is below the desired temperature range, controller 110 may increase power to heating elements 106. Increasing power to heating elements 106 in or on PCB 107 maintains or reduces the temperature loss in the vicinity of sensitive component 120 when the electrical system or a computer system is powered down. After completing an adjustment to heating elements 106, controller 110 measures the temperature of sensitive component 120 (506). As previously discussed, controller 110 queries one or more temperature sensors 108 in the vicinity of or in sensitive component 120.

Responsive to controller 110 determining that the temperature is in the desired temperature range (yes branch of decision 508), controller 110 determines whether an electrical system is turned on (decision 512). When controller 110 determines that current temperature of sensitive component 120 is within the predetermined, desired temperature, controller 110 verifies that the electrical system has been turned on (yes branch of decision 512). Responsive to determining the electrical system is turned on, controller 110 turns off the external power (e.g., battery 109) to heating elements 106 (514). As the power of the electrical system is turned on, the various components such as chip 102 receive power and begin generating heat. As the various components such as chip 102 receive power and begin generating heat, the temperature delta or the range of the temperature change experienced in a thermal cycle is decreased, resulting in less stress and strain on interconnects 105 associated with sensitive component 120 during thermal cycling, thereby reducing resulting thermal cycling fatigue. Controller 110 halts external power to heating elements 106 until controller 110 determines power is not provided to the electrical system (e.g., the electrical system is powered off again).

Responsive to controller 110 determining the electrical system is not turned on (no branch of decision 512), controller 110 measures one or more temperatures associated with sensitive component 120 (506). As previously discussed, controller 110 monitors one or more temperatures in the vicinity of and/or in sensitive component 120 using one or more temperature sensors 108 to maintain the temperature within the desired temperature range in decision 508.

In one embodiment, controller 110 may be configured with a predetermined delay time for heating element turn off after the electrical system resumes receiving power (e.g., a delay in turning off external power to heating elements 106 when a system is turned back on). For example, based on thermal fatigue models and previously recorded temperature excursions of sensitive component 120 in the electrical system during powering on a delay of five minutes may be configured in controller 110 for turning off heating elements 106 after the electrical system is turned on again. For example, a reduction in the thermal cycling fatigue can occur due to a reduction in the temperature change observed by sensitive component 120 and interconnects 105 (e.g., solder joints). As sensitive component 120 heats up due to re-applied power to chip 102, maintaining power to heating elements 106 for a short period time after the system is turned on minimizes temperature changes occurring at sensitive component 120 and interconnects 105.

In another embodiment, controller 110 determines that the power to the electrical system including sensitive component 120 is turned on (e.g., the electrical system is operating) and queries temperature sensors 108 to measure one or more temperatures associated with sensitive component 120 (as discussed in step 506). Controller 110 continuously, on a predetermined interval, requests the temperature associated with sensitive component 120. For example, controller 110 may query temperature sensor 108 on PCB 107 that is 15 mm from an outer row of interconnects 105 (as depicted in FIG. 1) every minute to monitor the current temperature associated with sensitive component 120. Controller 110 compares the current received temperature to a predetermined or desired temperature range.

Controller 110 determines whether the current received temperature is in the desired temperature range. Responsive to controller 110 determining the current received temperature is not within the desired temperature range, controller 110 initiates power to heating elements 106 using either power provided from the electrical system or from an external power source (e.g., battery 109). Upon initiating power to heating elements 106, controller 110 continues to monitor the temperature associated with sensitive component 120 by querying temperature sensors 108 for a current temperature and in response to receiving a current temperature, determines whether the received current temperature is within the desired temperature range. Responsive to determining the received current temperature is not within the desired temperature range, controller 110 adjusts heating elements 106 as previously discussed with respect to decision 508.

Responsive to controller 110 determining the current temperature is within the desired temperature range, then controller 110 turns off heating elements 106 and continues to monitor the temperature associated with sensitive component 120. In one embodiment, controller 110 continues to monitor and adjust the temperature associated with sensitive component 120 to maintain a current temperature within the desired temperature range until a command to stop monitoring is received by controller 110 from a user input on any known user interface capable of communicating with controller 110. In various embodiments, when controller 110 determines that the power is no longer turned on in the electrical system, controller 110 turns on one or more heating elements (step 504) and continues executing steps 506 through 514 as previously discussed with respect to FIG. 5.

In one embodiment, controller 110 may monitor and maintain a temperature associated with sensitive module 120 when an electrical system is powered on (e.g., receiving power to the electrical system or computer). For example, controller 110 continuously monitors and maintains a temperature associated with sensitive component 120 in the desired temperature range regardless of whether the power is supplied to the electrical system (i.e., controller 110 monitors and maintains a temperature in the vicinity of sensitive component 120 in both electrical system power ON and power OFF situations so steps 502 and 504 maybe skipped). In this embodiment discussed with respect to sensitive component 120, controller 110 executes step 506 to measure one or more temperatures associated with sensitive component 120 and determines whether the temperature is in the desired range (decision step 508), and responsive to determining that the temperature is not in the desired range, adjusts heating elements (step 510). However, if the temperature is within the desired range, controller 110 returns to step 506 to monitor the temperature associated with sensitive component 120.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method to reduce thermal cycling fatigue associated with an identified component in an electrical system, the method comprising:

determining, by a controller, whether the identified component is sensitive to thermal cycling fatigue by utilizing accelerated thermal cycling testing of the identified component in an electronic assembly and analysis of field returns of the identified component in the electrical system;

responsive to a determination that the identified component is sensitive to thermal cycling fatigue, determining, by the controller, power to the electrical system is turned off;

initiating, by the controller, power from an external power source to one or more heating elements in a vicinity of the identified component;

receiving, by the controller, a first temperature from one or more temperature sensors in the vicinity of the identified component;

determining, by the controller, whether the first temperature is within a predetermined temperature range; and responsive to determining that the first temperature is not within the predetermined temperature range, adjusting, by the controller, a power level of the one or more heating elements.

2. The method of claim 1, further comprising:
responsive to adjusting the power level of the one or more heating elements, querying, by the controller, the one or more temperature sensors for a second temperature; and
determining, by the controller, that the second temperature is within the predetermined temperature range.

3. The method of claim 1, further comprising:
responsive to determining that the temperature is within the predetermined temperature range, turning off, by the controller, power from the external power source to the one or more heating elements.

4. The method of claim 1, wherein the one or more heating elements are one of embedded in or are located on at least a portion of a surface of: a printed circuit board in the vicinity of the identified component, a module substrate of the identified component, a semiconductor chip in the identified component, a lid of the identified component, or a heat sink for the identified component.

5. The method of claim 1, wherein the external power source is one of an alternating current source or a direct current source, and wherein the direct current source is a battery.

6. The method of claim 1, further comprises reducing, by the controller, pump out of a thermal interface material thermally coupling a semiconductor chip to at least one of a module lid or a heat sink.

7. The method of claim 1 further comprises monitoring, by the controller, the one or more temperature sensors in the vicinity of the identified component to maintain a received second temperature within the predetermined temperature range.

8. The method of claim 1, wherein determining power to the electrical system includes maintaining, by the controller, power to the identified component from an external power source without using the one or more heating elements or the one or more temperature sensors.

* * * * *